United States Patent [19]

Shenoi et al.

[11] 4,302,631

[45] Nov. 24, 1981

[54] DECIMATOR APPARATUS FOR DECREASING THE WORD RATE OF A DIGITAL SIGNAL OF THE TYPE EMPLOYED IN DIGITAL TELEPHONE SYSTEMS

[75] Inventors: Kishan Shenoi, Fairfield; Bhagwati P. Agrawal, Shelton; Larry K. I. Chu, Norwalk, all of Conn.

[73] Assignee: International Telephone and Telegraph Corporation, New York, N.Y.

[21] Appl. No.: 98,094

[22] Filed: Nov. 28, 1979

[51] Int. Cl.³ .......................... H04B 1/66; G06F 3/00
[52] U.S. Cl. ............................. 179/15.55 R; 179/1 P; 364/724
[58] Field of Search ............... 179/15.55 R, 15.55 T, 179/1 D, 1 P; 364/724, 723, 200, 900 MS File; 375/103; 370/118, 84

[56] References Cited

U.S. PATENT DOCUMENTS

| | | | |
|---|---|---|---|
| 3,973,081 | 8/1976 | Hutchins | 179/1 SA |
| 3,988,607 | 10/1976 | Eggermont et al. | 364/724 |
| 4,020,332 | 4/1977 | Crochiere et al. | 364/723 |
| 4,021,616 | 3/1977 | Betts | 179/15.55 T |

OTHER PUBLICATIONS

P. VanGerwen, et al., "A New Type of Digital Filter etc.", IEEE Trans. on Comm., Feb. 1975, pp. 222–234.
M. Tubiana, "Digital Filter Having Integral Coefficients", IBM Tech. Discl. Bull., Mar. 1976, pp. 3322–3324.

Primary Examiner—Mark E. Nusbaum
Assistant Examiner—E. S. Kemeny
Attorney, Agent, or Firm—John T. O'Halloran; Jeffrey P. Morris

[57] ABSTRACT

There is disclosed a decimator structure which incorporates the cascade of an FIR filter with a low pass recursive filter. The input to the decimator is obtained from a high rate analog to digital converter. The output from the decimator is a low rate digital signal having an increased word length. The decimator serves to reduce the word rate and increase the word length of the output digital signal of the analog to digital converter. In this manner, the low rate digital signal at the output of the decimator can be easily accommodated by the telephone system. The decimator described does not require conventional hardware multipliers and hence, affords efficient and economical circuit components which can be implemented by conventional integrated circuit techniques. A register further reduces the pulse rate for transmission.

26 Claims, 9 Drawing Figures

DECIMATOR APPARATUS FOR DECREASING THE WORD RATE OF A DIGITAL SIGNAL OF THE TYPE EMPLOYED IN DIGITAL TELEPHONE SYSTEMS

FIELD OF INVENTION

This invention relates to decimators in general and more particularly to a decimator apparatus for decreasing the word rate and increasing the number of bits of a digital signal to enable transmission of the same via a communications system.

BACKGROUND OF THE INVENTION

In modern day communication systems, digital data is employed for transmission via a switching matrix to various subscribers associated with the system. The use of digital data enables efficient transmission and enables the various system modules to be implemented by integrated circuit techniques which are particularly well suited for the fabrication of digital circuitry.

In a digital telephone system, one converts analog or voice data to digital signals for processing and transmission via a switching matrix. The digital signals are converted back to analog signals to enable subscribers of the system to conventionally communicate. The digital telephony system enables one to implement subscriber line circuits mainly by employing digital circuitry which, as indicated, can be integrated as by LSI, large scale integrated circuits and hence, offers substantial reduction in costs and efficient and reliable operation.

The conversion of signals to analog or digital signals necessitates the use of both digital to analog converters and analog to digital converters. In any event, due to the cost considerations in any telephone systems, one must be concerned with economics as well as reliable operation consistent with modern day telephony requirements.

To implement analog to digital conversion, an analog signal is sampled at a high word rate, to provide digital words of a relatively small number of bits, each indicative of a weighted value of the analog signal. Such analog to digital converters (A/D) are referred to as "high-rate" devices and many suitable configurations are known.

In order to provide efficient transmission of the digital data obtained from a high rate converter, one must decimate (reduce) the word rate and increase the word length. This is done in the prior art by the use of digital filters designated as low pass devices to enable the high rate output signal to be decimated to a lower rate signal, which can be more readily handled and processed.

In any event, digital filters require multipliers, which are extremely expensive and complicated. For examples of such prior art filters, reference is made to U.S. Pat. No. 3,912,917 issued on Oct. 14, 1975 to H. Nussbaumer and entitled DIGITAL FILTER. This patent describes such filters and, in fact, attempts to reduce the number of multipliers required and hence, recognizes the problem associated with such devices.

Other patents as U.S. Pat. No. 4,021,654 issued on May 1, 1977 to H. H. Harris et al and entitled DIGITAL FILTER described filter embodiments used with LSI circuit techniques. Digital filters may also be accommodated by the use of computer circuits as evidenced by a recent article entitled "Implement Digital Filters Efficiently" by R. J. Karkowski and published in Electronic Design, Sept. 1, 1979, page 110 by Hayden Publishing Co.

Thus, it should be apparent that in a telephone system, which is an extensive communication transmission system, one must minimize hardware for both economic and reliability factors. Furthermore, in equipment employed in a telephone line circuit, costs and reliability are a prime factor as the line circuit is needed for each subscriber and hence, it is a system block which is repeated directly according to the number of subscribers.

While economics is a paramount concern, one must, of course, assure reliable and proper operation to afford to the subscriber the most optimum communications facilities.

The process of converting an analog signal to a digital signal in a high rate converter or in an A/D converter provides "quantizing" noise. In employing a high rate converter, such noise has a "high pass" spectrum and hence, as indicated, can be reduced by digital filtering. Thus, a decimator must attenuate the quantizing noise while decimating or decreasing the word rate, that is, by discarding data words such that the output word rate of the analog to digital converter, which is the input word rate of the decimator, is greater than the output word rate of the decimator by a factor of, for example, thirty two. The decimator is the dual of an interpolator, as the interpolator increases the word rate of a digital signal prior to performing a digital to analog (D/A) conversion, for example, by a factor of thirty two. Such interpolators are described in U.S. Pat. No. 4,109,110 entitled DIGITAL TO ANALOG CONVERTER issued on Aug. 22, 1978 to M. J. Gingell.

The problem of implementing a decimator function or an interpolator function while avoiding multipliers is applicable to both structures. The concepts and structure to be described herein are particularly adaptable for performing decimation and techniques for performing interpolation are described in a copending application entitled INTERPOLATOR APPARATUS FOR INCREASING THE WORD RATE OF A DIGITAL SIGNAL OF THE TYPE EMPLOYED IN DIGITAL TELEPHONE SYSTEMS by K. Shenoi et al and filed on Nov. 28, 1979 as Ser. No. 098,105, and assigned to the assignee herein.

While the use of a digital filter to provide a decreased output word rate is known, it must be of an economical and reliable configuration to accommodate the stringent cost and operation requirements associated with a telephone switching system. Thus, an object of this invention is to provide a decimator apparatus which reduces the output word rate of a high rate A/D converter, while eliminating the need for expensive hardware multipliers. The decimator apparatus further serves to reliably attenuate quantizing noise without interfering with the band of the analog signals (0–4 KHz) indicative of speech or voice signals. The decimator structure is easily implemented with conventional hardware and hence, enables the use of integrated circuit modules.

BRIEF DESCRIPTION OF PREFERRED EMBODIMENT

In accordance with this invention, the technique of reducing the word rate from a high input data word rate without introducing distortion by way of loss of essential information in the output words is described. In decimation, the number of bits/word is increased, for example, from 1-bit/word to 13-bits/word; and the word rate is decreased, for example, from 1.024 M word/sec to 32 K word/sec (a factor of 32).

A decimator apparatus for decreasing the word rate of an input digital signal, said input digital signal consisting of a plurality of digital words, each having the same number of given bits, with said rate of said digital signal being of a predetermined value fs comprising a cascaded digital filter arrangement having an input terminal and an output terminal, with, in a preferred embodiment a finite impulse response (FIR) filter is in cascade with and feeds a second order digital low pass recursive filter between said input and output terminals, said recursive filter characterized in having a transfer function defining filter coefficients to be of the form $2^{-K}$, where K is an integer to permit filtering of said input digital signal as applied to the input terminal of said cascaded arrangement, to provide at said output terminal an output filtered digital signal having a plurality of digital words, each of a greater number of bits than said input words and at a rate equal to said predetermined rate, and register means responsive to said output signal of said greater number of bit words for transferring said output signal at a lower rate than said predetermined rate, whereby said register means provides at an output, a decimated signal having a plurality of words each of a greater bit length than said input words and each manifesting the weighted value of said input words at a decreased word rate.

DETAILED DESCRIPTION OF THE INVENTION

Figure 1:
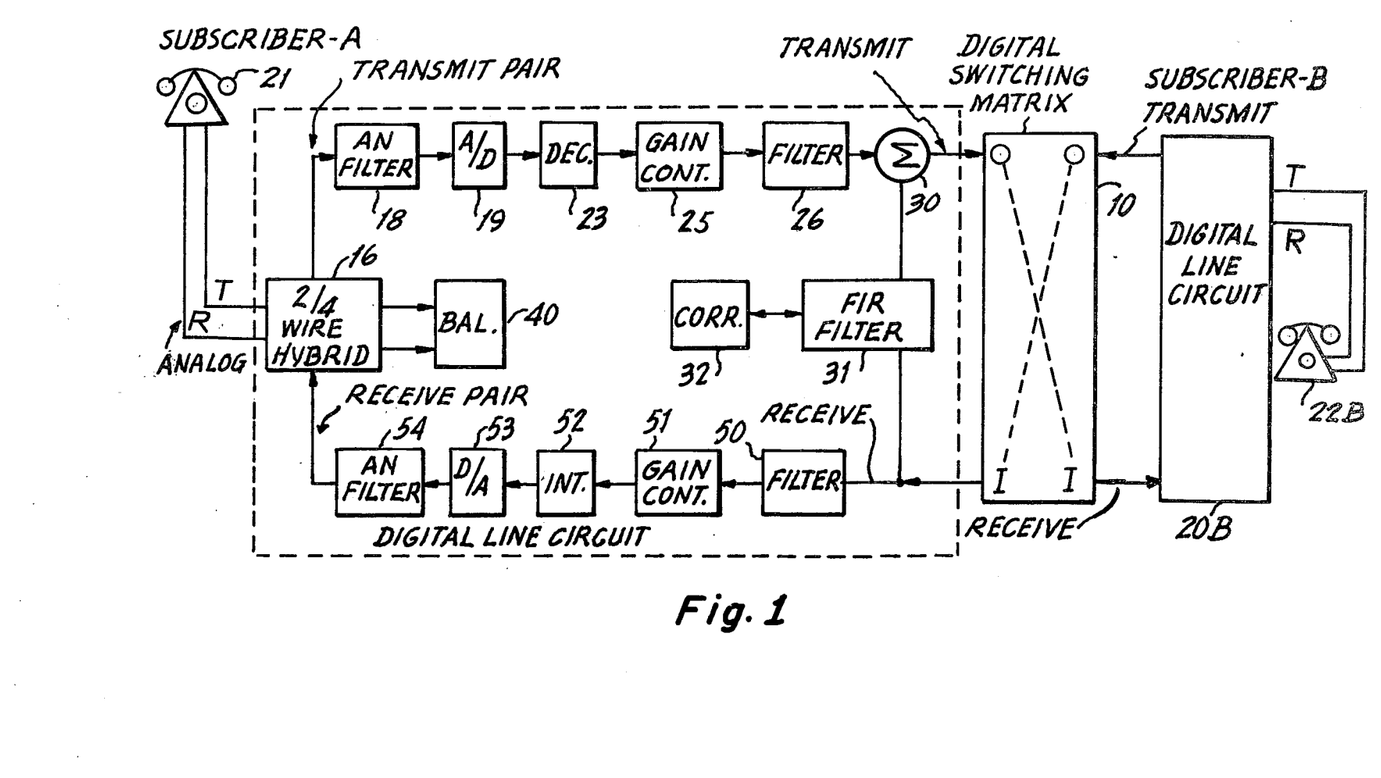
FIG. 1 is a schematic block diagram of a telephone switching system showing a subscriber A and an associated digital line circuit connected via a switching matrix to a subscriber B.

Referring to FIG. 1, there is shown a simplified diagram of a telephone communications system employing digital and analog signal paths. Essentially, a single subscriber A is connected via a digital switching matrix 10 to another subscriber B. Each subscriber as A has a separate line circuit 20 associated with his subset and to enable communications between the parties. While subscribers A and B are shown associated with subsets as 21 and 22, it is understood that the subscribers could be trunk locations for connecting to other central offices and so on, and as such, would also require a line circuit as 20. In order to simplify the explanation, a single line circuit 20 is shown for subscriber A and it is understood that subscriber B has an identical line circuit 20B as does the plurality of additional subscribers not shown in FIG. 1.

For an example of a digital line circuit employed in a switching system, reference is had to U.S. Pat. No. 4,161,633 entitled SUBSCRIBER LINE/TRUNK CIRCUIT issued on July 17, 1979 to Robert Treiber and assigned to the International Telephone and Telegraph Corp., the assignee herein.

The telephone subset 21 associated with subscriber A is coupled via a two-wire analog line including tip (T) and ring lines (R) to a two-to-four wire hybrid or converter circuit 16. The hybrid 16 is a well known component and essentially connects the two wire analog line to a four wire line. Hence, the output of the hybrid 16 is coupled to two wires shown as a single line and designated as a transmit pair and two wires (single line) designated as a receive pair. A description of suitable hybrid circuits and operation may be had by referring to a text entitled "Reference Data for Radio Engineers", Sixth edition (1975) Howard W. Sams, pages 35-16 through 35-20. A digital hybrid circuit is described in copending U.S. patent application, Ser. No. 903,458 filed on May 8, 1978 and assigned to the assignee herein.

The transmit pair via hybrid 16 is coupled to the input of an analog filter 18. As one can ascertain, the signal as propagating from the hybrid 16 through the filter 18 is an analog signal. The output of the filter 18 is coupled to the input of an analog to digital converter (A/D) 19. The analog to digital converter 19 may be a pulse code modulator (PCM) device and operates to sample and digitize the analog output signals from filter 18 to provide a digital signal at its output. While one may employ a pulse code modulated signal (PCM), other techniques for analog to digital conversion are applicable. The PCM or digital signal is provided at the output of the A/D 19. This digital signal is applied to the input of a decimator module (DEC) 23. Essentially, the decimator module 23 is a digital filter which functions to decimate or reduce the output word rate of a digital signal applied to its input. In the above discussion, it was indicated that the analog to digital converter 14 is a PCM device, but other types of A/D converters could be employed as well.

In any event, depending upon the signal, a decimator as 23 may be employed to filter or provide attenuation to the digital signal for frequencies outside the band of interest or in this case, for frequencies outside the voice band (0–4 KHz). The decimator 23 is a second order recursive filter having a low pass filter characteristic. The decimator 23 provides a signal at its output at a lower word rate than the word rate available from the analog to digital converter 19. For example, the output digital signal from the A/D converter 19 may be at a sampling frequency (fs) or a word rate of 1.024 MHz with three bits per word. The output of the decimator 23 would be at a sampling frequency (fs) or a word rate of 32 KHz with a word length of 13+ bits per word.

As will be explained, the decimator 23 is implemented by the use of conventional digital components and based on the structure and operation, is particularly adapted to handle digital signals emanating from the A/D converter 19 and to process these signals with low noise for eventual transmission to a remote subscriber as B via the matrix 10.

The output words or digital signal developed by the decimator 23 is applied to a digital gain control circuit 25. The digital gain control is described in detail in a copending application entitled GAIN CONTROL APPARATUS FOR DIGITAL TELEPHONE LINE CIRCUITS by B. P. Agrawal et al filed on Nov. 28, 1979, Ser. No. 098,110, and assigned to the assignee herein.

It is understood that the overall design philosophy of a line circuit is based upon the interrelation and functions of the various circuit components employed, but the decimator 23 may have broader application in the digital circuit field.

The output of the gain control 25 is applied via a non-recursive audio filter 26 to a summing network 30. The filter 26 has a bandwidth determined by the range of audio signals for transmission via the transmission path of the switching network 10. Another input to the summing network 20 is derived from a FIR filter 31. The filter 31 operates in conjunction with a correlator 32 to suppress or cancel the effects of echo in the line circuit. The operation and discussion of the echo suppression circuit has been described in detail in a copending application entitled ADAPTIVE DIGITAL ECHO CANCELLATION CIRCUIT, Ser. No. 020,593 filed on Mar. 14, 1979 for B. P. Agrawal et al and assigned to the assignee herein.

The output of the summer 30 is applied to the switching matrix 40 where it is directed when a connection is made by the switching system to the receive input of a called subscriber as B. The subscriber's line circuit 20B is identical to the line circuit 20 shown for subscriber A. Hence, as can be ascertained, the digital output signal from the transmit output (O) of the line circuit 20 of subscriber A is applied via the digital switching matrix 10 to the receive input (I) of the line circuit 20B. Examples of digital switching matrices as 10 can be had by referring to a copending application entitled MULTIPORT DIGITAL SWITCHING ELEMENT, Ser. No. 888,582 filed on Mar. 17, 1978 now U.S. Pat. No. 4,201,890 for A. J. Lawrence et al and assigned to the assignee herein.

The receive input (I) from the matrix 10 is coupled to the receive pair of the digital line circuit. In this manner, the digital signal from the transmit output (O) of the remote subscriber is directed to the input of a non-recursive audio filter 50, having the same band pass characteristics as filter 26. The output of filter 50 is applied to the input of a gain control circuit 51 which essentially, is of the same configuration as gain control 25. The digital signal as controlled in gain at the output of gain control 51 is applied to an interpolator circuit 52. Basically, the interpolator 52 functions to increase the word rate of the digital signal.

As indicated, in the transmit path, the decimator 23 will decrease the word rate to 32 KHz at thirteen bits or more per word. The interpolator 52 increases the word rate to 1.024 MHz at three bits or more per word or to another rate determined by the sampling rate employed. The output of the interpolator 52 is applied to the input of a digital to analog converter (D/A) 53. The D/A converter 53 operates to selectively sample the digital signal at the output of the interpolator 52 to provide at an output, an analog signal, which is applied via the analog filter 54 to the hybrid 16. The use of an interpolator 52 in conjunction with an applicable type of digital to analog converter 53 is described in detail in the above cited U.S. Pat. No. 4,109,110 entitled DIGITAL TO ANALOG CONVERTER.

Other types of interpolators and digital to analog converters may be employed as well. A particularly useful digital to analog converter is described in a copending application entitled DIGITAL TO ANALOG CONVERTER EMPLOYING SIGMA-DELTA MODULATION FOR USE IN TELEPHONE SYSTEMS, Ser. No. 098,103 filed on Nov. 28, 1978 by B. P. Agrawal et al and assigned to the assignee herein. An interpolator, as indicated above, which is particularly suited for operation in the line circuit as interpolator 53 is described in a copending application referenced above and entitled INTERPOLATOR APPARATUS FOR INCREASING THE WORD RATE OF A DIGITAL SIGNAL OF THE TYPE EMPLOYED IN DIGITAL TELEPHONE SYSTEMS.

The output analog signal, as indicated, is filtered and applied to the receive port of the hybrid 16 where it is then applied to the two wire subscriber lines and hence, to the subset 21.

Accordingly, the above description depicts a digital line circuit operative to process an analog signal to a digital signal in a transmit path and to convert the digital signal back to an analog signal in the receive path.

DECIMATOR OPERATION AND DESIGN

As indicated above, the quantizing noise from a high rate A/D converter as 19 of FIG. 1 has a "high pass" type spectrum and the out-of-voice band noise can be reduced by subsequent filtering.

Figures 2, 3:
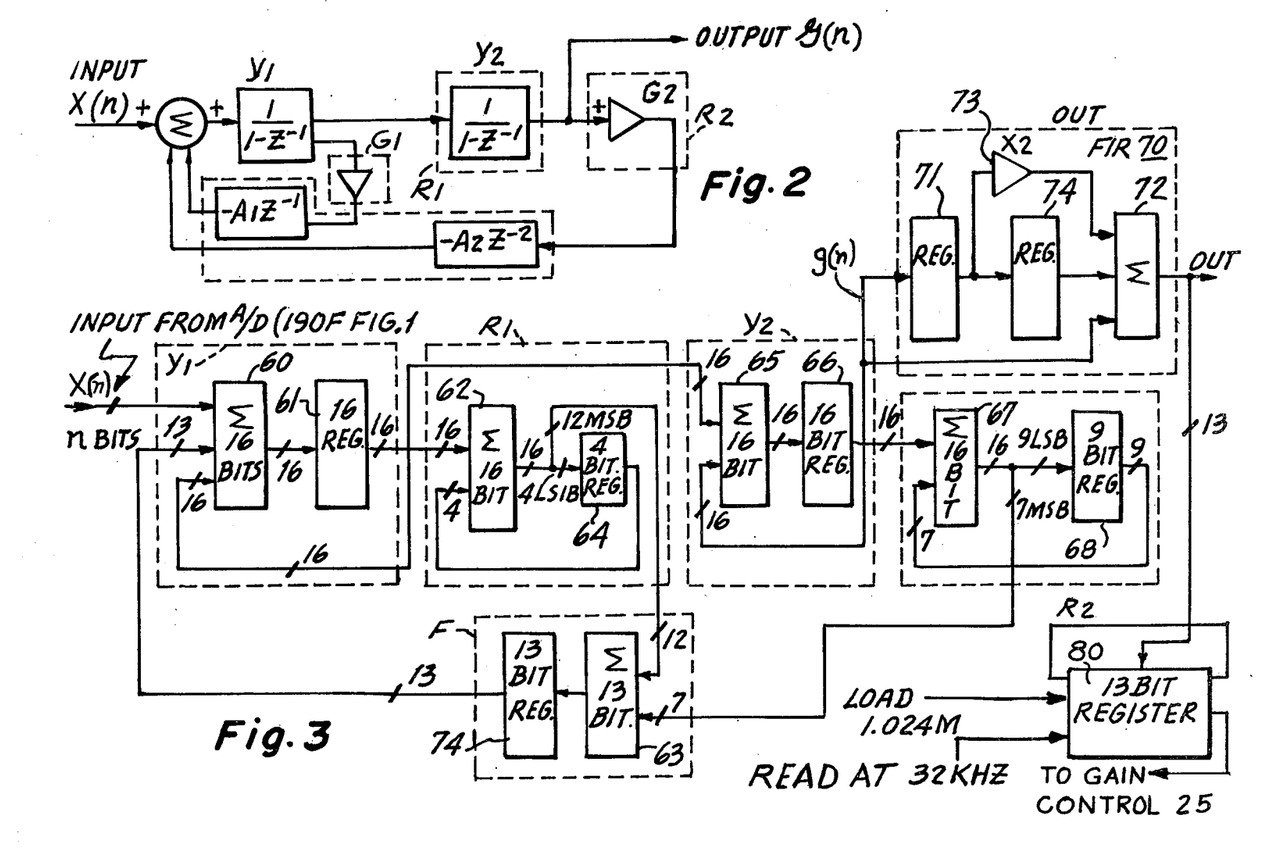
FIG. 2 is a simplified block diagram showing the basic structure for a recursive filter employed in the decimator.
FIG. 3 is a detailed schematic diagram of a decimator including a recursive filter cascaded with a finite impulse response (FIR) filter.

FIG. 2 depicts the general format for a second order recursive filter according to this invention, which configuration will attenuate the out-of-band noise emanating from the A/D converter 19. As will be explained, the structure shown in FIG. 2 permits all the filter coefficients to be of the form $2^{-K}$, where K is an integer. This therefore eliminates the need for multipliers.

It is known that the general recursive filter does require multipliers as operation is contingent upon the computation of values as Y by performing n multiplications. In the recursive filter, a sample $Y_i$ is determined by an expression which uses the previously computed sample $Y_i - K_1$, hence:

$$Y_i = A_1 X_1 + \sum_{K=1}^{n} b_K \cdot Y_i - K$$

The above noted expression is well known and it can be seen, as indicated, that for every value $Y_i$ to be computed, one has to perform n multiplications.

In viewing the structure of FIG. 2 and considering that great attenuation is required outside the voice band with little or no attenuation in the voice band (0-4 KHz), a second order digital Butterworth filter is considered. In order to design a digital filter, one must first implement the design in the analog domain by converting the filter's transfer function from analog to digital, or rather, from the S plane to the Z plane. Thus, by using the bilinear transformation:

$$S = (Z-1/Z+1)$$

one can perform such a conversion. If $f_D$ is the desired 3-db frequency of the digital filter, the "equivalent" analog Butterworth filter would have a 3-bd frequency WA rad/sec given by:

$$WA = \tan(\pi f_D/f_S)$$

Since $f_D$ is on the order of 8 KHz and fs (sampling frequency of input digital signal):

$$f_S = 1.024 \text{ MHz}$$

then:

$$WA \approx (\pi f_D/f_S)$$

The second order Butterworth transfer function G(S) with a 3 db frequency WA rad/sec is given by:

$$G(S) = \frac{g}{S^2 + \sqrt{2}\, W_A S + W_A^2}$$

g=constant used to adjust the gain at D.C.

If one now applies the bilinear transformation, the equivalent digital transfer function H(Z) is:

$$H(Z) = \frac{g(1-Z^{-1})^2}{D(Z)}$$

where:

$$D(Z) = 1 - \left[2 - \sqrt{2}\, W_A + 2\sqrt{2}\, W_A^3 - 2W_A^4...\right] Z^{-1} + \left[1 - 2\sqrt{2}\, W_A + 4W_A^2 - 2\sqrt{2}\, W_A^3...\right] Z^{-2}$$

Since $W_A$ is of the order of $2^{-5}$, the roots of D(Z) or filter poles are close to $Z=+1$. The structure shown in FIG. 2 will implement poles close to $Z=+1$.

If $G_1$ and $G_2$ of FIG. 2 are constrained to be of the form of $2^{-K}$ and $A_1 = A_2 + 1$, the transfer function F(Z) is shown to be:

$$F(Z) = \frac{1}{1 - (2 - G_1)Z^{-1} + (1 - G_1 + G_2)Z^{-2}}$$

where $Z^{-N} = N$ word delay at the input word rate fs (1.024 MHz).

This transfer function F(Z) specifies that one does not require a multiplier to implement the structure of FIG. 2.

From the above equations $G_1$ can be approximated as:

$$G_1 \approx 2\sqrt{2}\, \pi \frac{f_D}{f_S}$$

and the gain at D.C. is:

$$F(Z)/Z = 1 = \frac{1}{G_2}$$

By selecting $G_1 = 2^{-4}$ and $G_2 = 2^{-9}$:

$$f_D \approx 7.5 \text{ KHz}$$

D.C.gain = $2^9$.

The required H(Z) as defined above is realized by the cascade of F(Z) and a second order finite impulse response (FIR) filter N(Z), where:

$$N(Z) = 1 + 2Z^{-1} + Z^{-2}$$

The gain at D.C. of N(Z) is $2^2$ giving H(Z) an overall gain at D.C. of $2^{11} = 2^9(2^2)$ or the cascaded gain of F(Z) and N(Z).

A finite impulse filter or FIR filter is well known in the digital art. This filter (FIR) is also referred to as a transversal filter and operates similarly to a tapped delay line. A FIR filter having the transfer function N(z) requires no multipliers. The FIR filter is well known in the digital art and can be implemented by two length N (N words of storage) recirculating shift registers. One register stores the N bit coefficients of a previous word, while the other register stores the N bits of a new word. One register, as will be explained, is shifted to the left to perform a multiplication by 2. Multiplication by two in this manner is not what is meant by a binary multiplier for multiplying one binary word by another. For examples of such binary multipliers of the type used in digital filters, reference is made to a text entitled "Arithmetic Operations in Digital Computers" by R. K. Richards, D. Van Nostrand & Co. (1955), chapter 5 entitled "Binary Multiplication and Division".

The use of multipliers in recursive filters is further ascertained from the above cited patent, U.S. Pat. No. 3,912,917. The FIR filter, as will be explained, includes a summer or adder which adds the contents of the registers with the incoming word to modify the same. Examples of FIR filters which will operate accordingly, are further described in the above cited application entitled ADAPTIVE DIGITAL ECHO CANCELLATION CIRCUIT.

As indicated in FIG. 2, each module has been assigned a letter indication as $Y_1$, $Y_2$, $R_1$, $R_2$ and F. The functions depicted by the modules in FIG. 2 are as follows:

$Y_1$ and $Y_2$ are accumulators which essentially operate to store one digital number and upon the receipt of another digital number, add the two and store the sum. Examples of typical accumulators as $Y_1$ and $Y_2$ are given in the above noted text by Richards on pages 98,101 to 113,124.

$R_1$ and $R_2$ designate binary dividers which perform division by shifting the contents of registers associated therewith, a given number of positions to the right. This aspect of performing binary division is well known, but the dividers according to this invention can operate within the noise requirements of the system by a unique feedback scheme. This technique will be explained in detail.

Referring to FIG. 3, there is shown one embodiment of a decimator according to this invention. Before proceeding with an explanation of FIG. 3, it is indicated that the structure depicts parallel bit operation. Hence, registers shown in FIG. 3, as for example, register 61 have sixteen output lines; one for each stage. This is shown as a single line intersected by a small line with the number 16 above to indicate sixteen output bits. Hence, if one views the output of register 64, one will immediately ascertain that four bits are outputted in parallel. This representation is used for purposes of clarity and to simplify both the figures and explanation.

The block schematic in FIG. 3 depicts the hardware realization of the decimator employing an output FIR filter having the transfer function N(Z). The blocks labelled $R_1$ and $R_2$ perform the division by $2^4$ and $2^9$ respectively ($G_1 = 2^{-4}$, $G_2 = 2^{-9}$). The order of process, as will be understood by those skilled in the art is $Y_1$, $R_1$, F, $Y_2$ OUT, $R_2$. All these levels must be completed prior to the arrival of the next input word.

The 2's complement number system is used for number representation and for performing arithmetic operations and therefore, while processing $Y_1$, $Y_2$, F and OUT, when added to words of differing sizes, the sign bit of the smaller word is appropriately extended. In the blocks labelled $R_1$ and $R_2$, the smaller word is the error saved from the previous sample and is always positive. Therefore, zeroes are appended in the most significant bits to make up the correct word size.

The input to the decimator of FIG. 3 is obtained from the output of an A/D converter as 19 of FIG. 1, which consists in the most general case, of n bits, where n may be any given number of bits. However, for a high rate A/D converter, such as 19 of FIG. 1, it is assumed for present purposes that the number of bits is three.

The input bits at the 1.024 MHz rate are applied to the summing register 60 of an accumulator including an output register 61. As indicated, the accumulator operates to store the incoming digital word and to add this word to the next digital signal received. The output is stored in the sixteen bit register 61. It is seen that an input of thirteen bits which is the bit size to be provided at the output of the decimator is obtained from the feedback register located in module F as will be explained. As indicated, the summer 60 receives three bit input words at the above noted rate and appends zeroes in the most significant bits to implement the correct word size.

The output of the accumulator or the sixteen bits from register 61 are directed to the divider $R_1$. Essentially, division by $2^4$ implies a shift to the right of four places. This is accomplished very conventionally by the summing register 62 which is essentially a sixteen bit shift register capable of having its contents transferred to the right to perform a binary division of $2^4$. The divided word is truncated into twelve most significant bits which are fed to a summer 63 associated with the feedback control module F.

The four least significant bits which would normally be discarded are stored in register 64 where they are fed back to the summer 62 and added to the next word applied to its input. As will be explained, the addition of the four least significant bits as added to the next input sample, substantially reduces the inband noise of the decimator and serves to reshape the noise spectrum according to the operation of the A/D converter.

The sixteen bits which emanate from register 61 are transferred to the accumulator $Y_2$ as inputs to the summing registers 65 associated with that accumulator. As seen from FIG. 3, the accumulator $Y_2$ is shown in a conventional format and consists of summer 65 coupled to the sixteen bit register 66. The output bits of the register 66 are directed back to the input of the summer 65 to enable accumulator operation.

The output sixteen bits from register 66 are applied to a divider $R_2$ which performs a division by $2^9$. Essentially, the divider $R_2$ is of the same configuration as the divider $R_1$ and consists of a summing register 67 which operates to transfer or shift the bits received nine places to the right.

The sixteen bit output of the summer 67 is truncated to the seven most significant bits which are fed to the summer 63 associated with the feedback control F to provide a second feedback signal. The nine least significant bits which normally would be discarded by the register 67 are transferred to a nine bit register 68 where they are fed back and added to the next digital word to be divided by divider $R_2$ and hence, as will be explained, operate to perform error correction.

The output from the accumulator $Y_2$ consisting of sixteen bits with three zeroes appended to accommodate the sixteen bit register size is outputted to the FIR filter 70. Essentially, the FIR filter, as indicated above, consists of a first input register 71. Register 71 receives the input word as gated out from $Y_2$. The input word is also applied to an adding input of an output summer 72 associated with the FIR filter 70.

The contents of register 71 are shifted one place to the right to perform a multiplication of the binary word by a factor of 2 which is designated by module 73. This multiplied word is also applied to the input of the summer 72. The contents of the register 71 are stored in register 74 which has an output coupled to another input terminal of the summer 72. In this manner, the summer provides an output signal which is the sum of the present digital word as modified by the sum of the last digital word as stored in 74 and the present digital word as multiplied by 2. This technique serves to provide at the output of the FIR filter 70, an average value of the previous two digital words processed by the recursive filter section as outputted from accumulator $Y_2$.

The feedback control circuit 63 operates to store the sum provided by dividers $R_1$ and $R_2$ in the output register 74. This sum which is constrained to thirteen bits indicative of the final output word size is fed back to the summer 60 associated with accumulator $Y_1$ to modify the next digital word and hence, control the filter coefficients.

The output from the summer 72 associated with the FIR 70 is thirteen bits at the 1.024 MHz rate. The thirteen bits at the output are gated to a thirteen bit register 80 which is loaded at the 1.024 MHz rate. The contents of the register 80 are gated out at a rate of 32 KHz and hence, based on the rate of the incoming signal, the output of register 80 consists of one word for each thirty-two input words.

Essentially, the output as obtained from shift register 80 is missing thirty-one out of every thirty-two words. However, this is of no consequence based on the fact that the A/D converter which is the input to the summer 60 is at an extremely high rate (1.024 MHz) and of a very small word length (one to three bits).

Since the input signal which was digitized by the A/D converter 19 is a voice signal, it is characterized as a highly correlated signal at an extremely low rate (0-4 KHz). Accordingly, the average value of the signal varies very slowly and hence, based on the increased sampling rate of the A/D converter and the output gating rate of register 80, information content will not be lost.

FIG. 3 does not show the clocking or timing format for performing processing in the order indicated above, but the timing sequence and operation should be immediately apparent to those skilled in the digital art.

As can be ascertained from FIG. 3, the input word of n bits at the high rate is operated on by the filter to provide control signals for both dividers $R_1$ and $R_2$. These signals are stored in the feedback register and operate to modify the next word in proper sequence. In this manner, each word as inputted from the A/D converter is assured a value by the feedback control F to provide smooth transitions between words wherein each output word is indicative of the weighted value of the average of the input words within the bandwidth constraints imposed by the digital filter. Thus, each output word of thirteen bits emanating from the output register 80 at the 32 KHz rate is indicative of the average value of the input word samples obtained from the A/D converter 19. The output signal from register 80 is therefore a smoothly varying signal as constrained by the bandwidth limitations imposed by the digital filter.

It can be seen from FIG. 3 that the filter is devoid of any binary multipliers as indicated above, but in essence performs division which is analogous to multiplication by $2^{-K}$. The multiplication performed by the FIR filter is merely a shift of one place to the right and multiplication by a factor of 2 is not considered multiplication of two binary words, as explained above. Based on the fact that one employs the configuration depicted in FIG. 2 to implement the recursive filter as shown in FIG. 3, one can restrict the coefficients in performing the analog to digital transformation to be of the form of $2^{-K}$.

Figure 4:
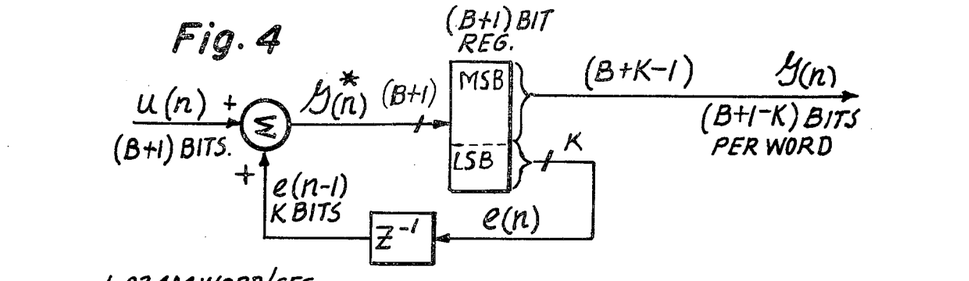
FIG. 4 is a simplified block diagram useful in explaining the operation of the divider employed with this invention.

Referring to FIG. 4, there is shown a generalized scheme of implementing a division by $2^K$ for the recursive filter section depicted in FIG. 3. Division by $2^K$ is equivalent to a right shift (or a left shift of binary point) of the number by K bits. However, if the low bits (LSB) are discarded, division by $2^K$ will introduce considerable inband "round-off noise" in the filter output.

Feeding back the error by delaying the least significant bits and adding the same to the next word provides noise spectrum reshaping. In FIG. 4, this is done based on the assumption that 2's complement arithmetic is employed.

The present sample $U(n)$, a $(B+1)$ bit word is added to the previous error $e(n-1)$, of K bits to provide $G(n)^*$. The $(B+L-K)$ most significant bits of $G(n)^*$ form the output $G(n)$ and the K least significant bits are stored and used in the next epoch or sampling interval where they are added to the next word $U(n+1)$. Assume $U(n)$ is an integer in 2's complement notation. Then:

$$G(n)^* = -2^B b_B + 2^{B-1} b_{B-1} + \ldots + 2^K b_K + \ldots + b_0$$

$$G(n) = 2^{B-K} b_B + 2^{B-K-1} b_{B-1} \ldots + 2^0 b_K$$

Division by $2^K$ involves shifting the implied binary point by K places. Using the $(B+1-K)$ bits for the output $G(n)$ would cause an error $e(n)$ given by:

$$2^K e(n) = G(n)^* - 2^K G(n)$$
$$= 2^{K-1} b_{K-1} + 2^{K-2} b_{K-2} + \ldots + 2^0 b_0$$

which is added to the next sample $U(n+1)$ to yield $G(n+1)^*$ before $G(n+1)$ is output.

Defining the output error signal $s(n)$ by:

$$s(n) = 2^{-K} U(n) - G(n)$$

yields:

$$s(n) = [e(n) - e(n-1)]$$

and if $See(Z)$ and $S'ss(Z)$ are the squared magnitude functions of $\{e(n)\}$ and $\{s(n)\}$ respectively, then:

$$Sss(Z) = (1-Z)(1-Z^{-1}) See(Z)$$

From this equation, it is clear that the error signal spectrum is zero at D.C. $(Z+1)$ which shows that the error energy in the frequency band if interest is small.

Thus, the use of the divider configurations $R_1$ and $R_2$ in FIG. 4 improve noise operation of the recursive filter, while eliminating the need for binary multipliers.

Basically, the decimator depicted in FIG. 3 has a frequency response which is $-10$ db down at an effective frequency of 12.5 KHz. The response of the filter is relatively flat from 0–4 KHz which is the band of concern.

The above description of a decimator as depicted in FIG. 3 operates with a high rate A/D converter which provides three bit words at a sampling rate of 1.024 MHz. Based on the nature of the analog signal (0–4 KHz), one could implement an A/D converter using a single bit as a one or zero to indicate the weighted value at the high sampling rate of 1.024 MHz. Accordingly, the output of such a high rate A/D converter would be manifested by a high density of output pulses for larger valued analog signals and a lower pulse density for lower values. In any event, the noise spectrum of a one bit A/D converter rises faster than the noise spectrum of three bit A/D converter at the same sampling rate of 1.024 MHz.

Since a decimator is a low pass filter designed to attenuate the out-of-band signal components, primarily quantization noise introduced by the A/D converter, such that, upon resampling at a lower rate (32 KHz), the noise energy aliased into the speech band is tolerable. In order to accommodate resampling of a one bit A/D converter, one has to provide decimation with a sharper roll-off and one has to consider idle channel noise which occurs at discrete multiples of the sampling rate (1.024 MHz).

Idling noise is generated by an A/D converter when the input is grounded or no input analog signal is applied. In this condition, the A/D converter will provide an output idling pattern, which idling pattern is different for a three bit A/D converter as to that of a one bit A/D converter. Hence, as can be ascertained, one requires a sharper roll-off decimator for a one bit A/D converter.

The idling pattern for a one bit A/D converter is of the form:

$$\ldots -1, -1, +1, +1, -1, -1, +1, +1 \ldots$$

The idling pattern for a three bit A/D converter is of the form:

$$\ldots -1, +1, -1, +1, -1, +1, -1 \ldots$$

Hence, the decimator following the one bit A/D converter would require a transition at (fs/4) where fs is the sampling frequency, as well as at (fs/2).

Circuit imperfections in the one bit converter may permit the idling pattern to be $N+1$'s followed by $N-1$'s (the worst case idling pattern of period 2 N samples) with $N>2$, requiring additional transmission zeroes at several multiples of the sampling frequency.

Figures 5, 6:
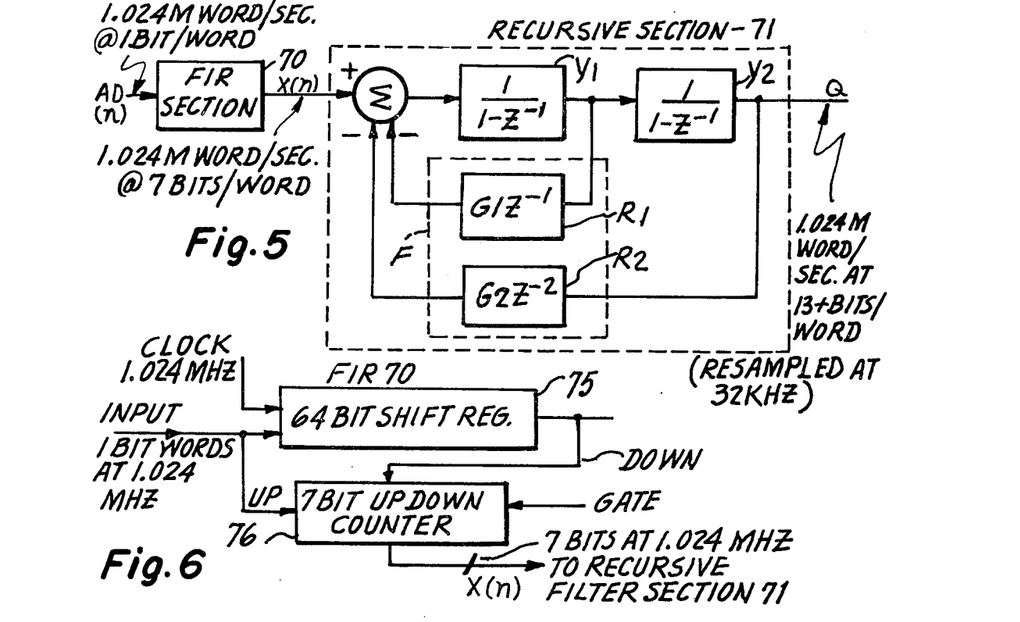
FIG. 5 is a simple block diagram of a decimator apparatus according to this invention.
FIG. 6 is a simplified block diagram of a FIR filter according to this invention.

Referring to FIG. 5, there is shown a FIR filter 70 in cascade with a second order recursive filter 71 to form a decimator. The word rates and bit lengths are shown on FIG. 5. If one compares the recursive filter section with FIG. 2, one can see that they have identical transfer functions, where $A_1 = A_2 = 1$ (FIG. 2) and $G_1$ and $G_2$ are combined with $Z^{-1}$ and $Z^{-2}$ in the feedback block F.

The FIR section 70 provides transmission zeroes at multiples of 16 KHz and is followed by the second order recursive filter 71 is described. This embodiment also does not employ binary multipliers as explained above as all coefficients are constrained to be of the form $2^{-K}$. Hence, a multiply is replaced by a division and afforded by a simple shift. The transfer function H(z) of the structure depicted in FIG. 5 is:

$$H(Z) = \frac{\sum_{i=0}^{63} z^{-i}}{1 + (-2 + G_1)Z^{-1} + (1 - G_1 + G_2)Z^{-2}}$$

When operating at a sampling rate of 1.024 MHz with $G_1 = 2^{-4} + G_2 = 2^{-9}$, the transfer function assures a low pass filter with transmission zeroes at multiples of 16 KHz and a 3 db point of approximately 6 KHz. The configuration will provide at least $-20$ db attenuation for frequencies above 16 KHz.

Referring to FIG. 6, there is shown one embodiment of the FIR filter section 70 of FIG. 5. The FIR filter 70 comprises a sixty-four bit shift register 75. The last output stage of register 75 is coupled to the down count input of an up-down counter 76 having seven stages (for 2's complement arithmetic) or six stages to provide at least six bits indicative of $2^6(64)$. The up count input of counter 76 is coupled to the input word line of one bit words at 1.024 MHz rate. Up-down counters as 76 and shift registers as 75 are well known in the art. The up-down counter 76 is sometimes referred to as a forward backward counter and provides an up count of one for each pulse applied to the "up" input and down count of one for each pulse applied to the "down" input. See a text entitled "Pulse and Digital Circuits" by Millman and Taub, McGraw Hill (1956), Chapter 11 entitled "Counting" for examples of such counters as well as many other texts involving digital circuits.

The operation of the circuit of FIG. 6 is as follows:

The register 75 serially receives sixty-four bits as sixty-four one bit words and gates the bits at the clock rate. Hence, the last word bit (64th) is gated out upon receipt of the counter at the input of the 65th word bit. This (65th) word bit is therefore applied to the up input of counter 75, the same time the gated out bit (64th) is applied to the down input. If the bits are the same, there is no count. However, if the input bit is a one and the gated out bit is a zero, the counter 76 counts one bit up. If the bits are opposite, ie., input is a zero and the gated bit is a one, the counter counts down one. Thus, as can be ascertained, the counter 75 will compare the word applied to the input of register 75 with the word applied sixty-five bits ago. The output of the counter 76 is gated out at the 1.024 MHz rate at seven bits per word, where the seven bits represent the average value of the input words. Hence, the counter 76 keeps track of the number of ones or zeroes in the incoming digital signal. The seven bit words at the 1.024 MHz rate are now indicative of the average value of the last sixty-four bits, each bit a word from the one bit A/D converter. This operation provides a finite impulse response to provide transmission zeroes at the 16 KHz multiples, based on the output bit length of seven bits from the FIR filter 70.

Figure 7:
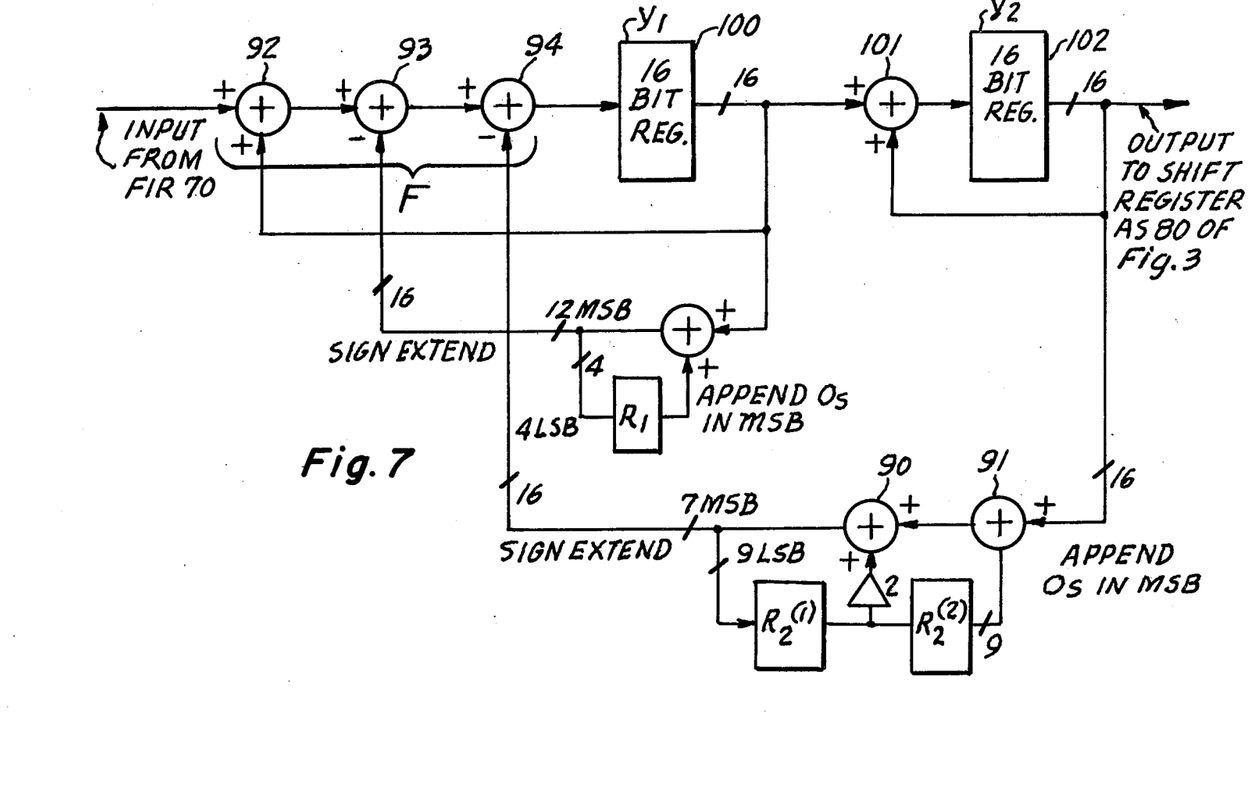
FIG. 7 is a schematic diagram of an alternate embodiment of a recursive filter according to this invention.
Figure 8:
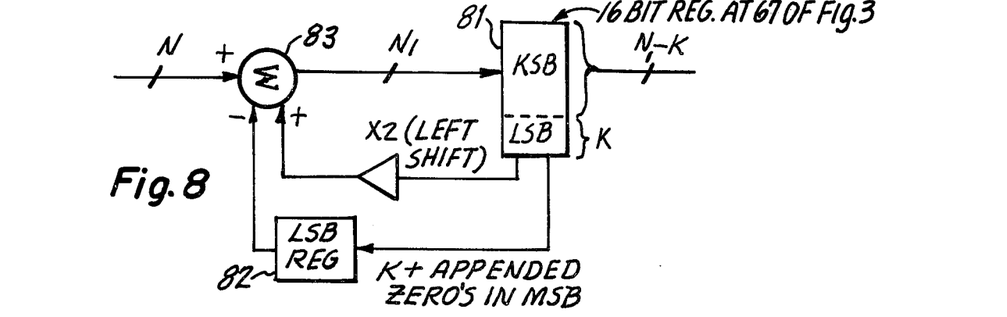
FIG. 8 is a simplified block diagram showing a divider useful in this invention for performing second order error correction.

Referring to FIG. 7, there is shown an alternate embodiment for the recursive section 71 of FIG. 5. It is noted at the onset that the same processing order as employed with FIG. 3 is appropriate and hence, similar functioning blocks as $Y_1$, $Y_2$, $R_1$ are designated the same. However, the function of $R_2$ which in FIG. 3 was a divider employing a single error feedback path is now accommodated by $R_2^1$ and $R_2^2$. The block labelled $G_2$ (FIG. 5) analogous to $R_2^1$ and $R_2^2$ (FIG. 7) requires second order error shaping. In this embodiment, two previous error samples are saved, as opposed to one. This technique gives further improvement in noise spectrum shaping.

Essentially, the same configuration for $R_2$ as depicted in FIG. 3 could be employed, but the configuration shown in FIG. 7 affords noise operation improvement.

Referring to FIG. 6, there is shown a generalized block diagram useful in explaining second order error correcting to explain the operation of $R_2$ in FIG. 7. Assume a first input word N of sixteen bits is applied to the input of the adder or summer 80. Adder or summer 80 is a full adder. Assume that no error signals are provided since N is the first word at $t=0$. Hence, the sixteen bits are stored in register 81. The most significant bits (MSB) are used as the output, as in this example, the seven MSB. The remaining nine least significant bits are the first K bits. These bits are stored in register 81 in the K bits (LSB) location. These K bits are shifted once to the left indicative of a multiplication of two and simultaneously, stored in the LSB register 82. The next word is $N_1$ at $t=1$. This word $N_1$ is applied to the summer 80 input and the multiplied K bits are added to this word. Hence, the register 81 receives the new word indicative of $N_1$ as modified by the multiplied K bits from N. A new set of least significant bits $K_1$ are now stored in register 81 as the LSB bits. The next word $N_2$ has subtracted from it, the K bits as stored in register 82, while the new $K_1$ bits are multiplied by two and added to the word $N_2$. These $K_1$ bits then replace the K bits and the sequence continues. Thus, as can be seen, the word $N_2$ has subtracted from it, the K bits indicative of the first word N, and added to it, the multiplied by two $K_1$ bits. This second order error correction assures that each successive word is modified by the least significant bits of the two previous words and hence, there is provided a second order error shaping.

Referring back to FIG. 7, the above described operation is afforded by $R_2^1$ and $R_2^2$ and is shown schematically and sequence wise by the structure depicted. In FIG. 7, $R_2^1$ corresponds to the storage of the least significant bits of register 82. The addition and the present multiplied error is accomplished in adder 90, while the subtraction of the previous error is accomplished in adder 91.

It is, of course, understood that the register comprising $R_2^1$ and $R_2^2$ is shifted to the right by nine places to achieve the division as described in FIG. 3. It is understood that one always increases the word size by appending zeroes in the most significant bit locations to allow the adders to respond to the same length word. This technique is well known and understood in the digital field and is indicated on the schematic, where appropriate.

In the embodiment shown in FIG. 7, the structure performs exactly as shown in FIG. 3 with the exception of the second order error correction afforded by $R_2$. However, the filter of FIG. 3 could be employed with the FIR 70 of FIG. 6 for the one bit A/D converter, without second order error correcting. This will not work as well as the structure depicted in FIG. 7 in regard to noise operation. Second order correction provides a more precise reduction of inband noise.

Shown in FIG. 7 are three full input adders 92, 93 and 94. A full adder configuration is employed and the full adder is a well known digital circuit component as described in the text entitled "Arithmetic Operations in Digital Computers" in Chapter 4 entitled "Binary Addition and Multiplication".

The adders 92, 93 and 94 are separate structures and operate with the input word serially. Hence, adder 92 receives the seven bit word from the FIR 79 and adds to it, the contents of register 100. Register 100 is part of the $Y_1$ function (FIG. 3) and together with the address 92,93 and 94 implement the $Y_1$ transfer function. The register 100 is a sixteen bit parallel-in, parallel-out of a D type structure. The "D" type configuration implies leading edge triggering of the stages and employs the well known D type multivibrator. The register 100 is loaded every clock cycle (1.024 MHZ). The adder 93 receives the sum output from adder 92 and subtracts from it, the output of the divider $R_1$. This output of twelve bits is extended to sixteen bits for compatibility.

Essentially, the adder 93 performs addition of the twelve MSB word from $R_1$ with the sixteen bit word from adder 92 and is equivalent to the operation performed by part of the summer 63 of FIG. 3, with 60 and 61. The adder 94 receives the modified seven bits output from divider $R_2$ and hence, the final input to $Y_1$ is modified by the divided words implemented by $R_1$ and $R_2$.

The output of register 100 is applied to an input of the full adder 101 which operates with register 102 (as $Y_2$ of FIG. 3) to provide the output word of thirteen bits (MSB), which output is applied to a shift register as 80 of FIG. 3 and gated out at the 32 KHz rate. The filter depicted still operates to miss thirty-one out of thirty-two words, but the same conditions as described for FIG. 3 are applicable, due to the high sampling rate of the A/D converter. The output word is applied to the divider $R_2$ as in FIG. 3 to complete the feedback loop and control F.

The operation of the recursive filter in FIG. 7 is identical with that of FIG. 3 with the exception of the second order error shaping by $R_2$. The maximum path is three input adders 92,93 and 94 and allows one cycle operation to assure that the adder outputs settle before processing the next word. Thus, the three adders in series is the maximum path for propagation delay.

Figure 9:
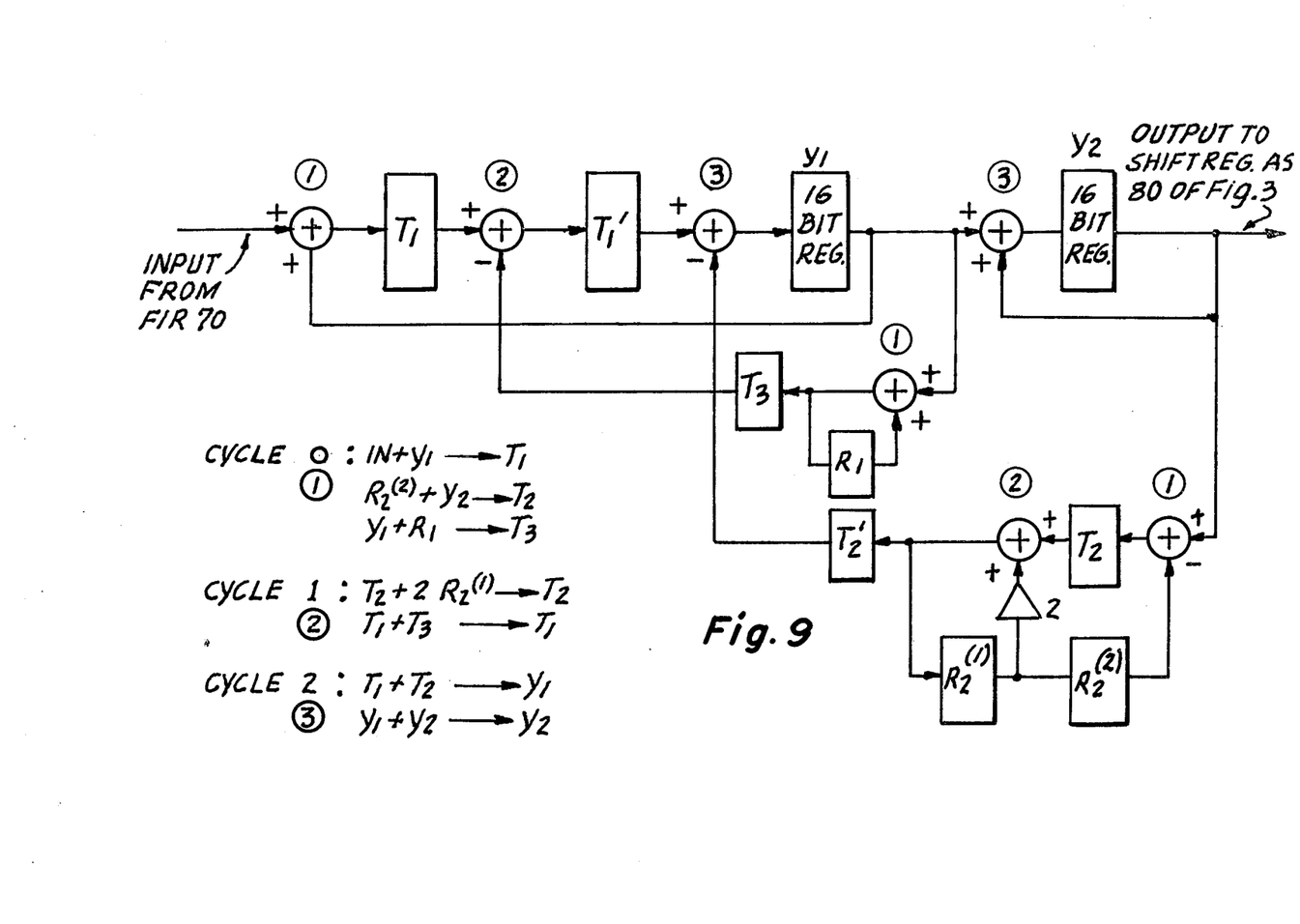
FIG. 9 is a schematic diagram of a recursive filter used in the decimator employing three cycle clock operation.

Referring to FIG. 9, there is shown a three cycle embodiment of a recursive filter as depicted in FIG. 7. A three cycle implementation of FIG. 7 can be employed by the use of holding registers designated as T. Basically, a holding register is a normal register of sixteen bits which is gated according to a three phase clock signal to hence, perform logic operations during each clock phase. In this manner, propagation delay or logic delay can be reduced as compared to single cycle operation as depicted in FIG. 7.

To denote three cycle operation, the cycles are shown as 1 , 2 and 3 in the diagram. A holding register as $T_1$ is operated on cycle 1 , $T_2$ on cycle 2 , $T_3$ on cycle 3 . The holding registers $T_1^1$, $T_2^1$ may be separate registers as may be included in registers $T_1$ and $T_2$ and hence, one can multiplex holding registers due to the transmittal of different data during each clock cycle.

In the diagram of FIG. 9, $R_1$ is a first order error correcting divider, as in FIGS. 3 and 7, and $R_2$ is a second order error correcting divider. The adders shown in FIG. 9 are all full adders and operate at the clock cycle (cycle number in a circle) indicated above each component. The cycle of operation is as follows, as will be understood by those skilled in the art:

During the FIRST CLOCK CYCLE 1 , the input word from the FIR 70 is added to the contents of the sixteen bit register $Y_1$ and the sum is held in register $T_1$. During cycle 1 , the contents of $R_2^{(2)}$, which is the previous error signal is subtracted from the contents of register $Y_2$ and stored in $T_2$, while the contents of register $Y_1$ are added to the divided output of $R_1$ and are stored in $T_3$.

During the next SECOND CLOCK CYCLE 2 , the contents of $T_2$ are added to the multiplied (by two) error provided by $R_2^{(1)}$ and stored in $T_2^1$ and the contents of holding register $T_1$ are added to the contents of holding register $T_3$ and stored in $T_1$.

During the next and last THIRD CLOCK CYCLE 3 , the contents of holding register $T_1$ are added to the contents of holding register $T_2^1$ and are transferred to register $Y_1$, while the contents of $Y_1$ is added with the contents of $Y_2$ and stored in $Y_2$ and hence, outputted as the output word. The cycle repeats for each successive input word to be processed. The cycle format is shown on FIG. 9 at the left.

Thus, there has been described a decimator structure incorporating the cascade of a FIR filter with a low pass recursive filter. The output of the low pass filter is a thirteen bit word at the original sampling rate (1.024 MHz), which is then applied to a shift register where it is read out at the desired lower rate of 32 KHz. The decimator serves to reduce the word rate and increase the word length of the output digital signal from the analog to digital converter of a high rate type which may provide one to three or more bits. In this manner, the lower rate digital signal can be easily accommodated by the transmission system for eventual reconstruction back to an analog signal by a digital to analog (D/A) converter. The decimator does not require conventional hardware multipliers and assures optimum noise operation by shaping the noise spectrum and hence, minimizing inband quantization noise.

It is understood that one skilled in the art will discern modifications and alternate structure as well as additional and alternate embodiments and applications and all such arrangements are deemed to be included within the spirit and scope of the claims appended hereto.

We claim:

1. A decimator apparatus for decreasing the word rate of an input digital signal, said input digital signal consisting of a plurality of digital words, each having the same number of given bits, with said rate of said digital signal being of a predetermined value fs, comprising:

a cascaded digital filter arrangement having an input terminal and an output terminal, with a finite impulse response (FIR) filter in cascade with and coupled to the input of a second order digital low pass recursive filter between said input and output terminals, said recursive filter characterized in having a transfer function defining filter coefficients to be of the form $2^{-K}$, where K is an integer, to permit filtering of said input digital signal as applied to the input terminal of said cascaded arrangement, to provide at said output terminal, an output filtered digital signal having a plurality of digital words each of a greater number of bits than said input words and at a rate equal to said predetermined rate, and register means responsive to said output signal from said recursive filter of said greater number of bit words for transferring said output signal at a lower rate than said predetermined rate whereby said register means provides at an output, a decimated signal having a plurality of words, each of a greater bit length than said input words and each manifesting the weighted value of said input words at a decreased word rate.

2. The decimator apparatus according to claim 1 wherein
said input digital signal is a digital signal obtained from the output of a high rate analog to digital converter operating at a sampling frequency of at least 1.0 Mhz.

3. The decimator apparatus according to claim 1 wherein
each of said input digital words has the same number of given bits between one to three.

4. The decimator apparatus according to claim 1 wherein
each of said output digital words has said greater number of bits between ten to sixteen, and preferably thirteen bits per word.

5. The decimator according to claim 1 wherein the transfer function F(Z) of said recursive filter is:

$$F(Z) = \frac{1}{1 - (2 - G_1)Z^{-1} + (1 - G_1 + G_2)Z^{-2}}$$

where:
$G_1$ = coefficient of the form $2^{-K}$
$G_2$ = coefficient of the form $2^{-K}$
$Z^{-1}$ = one word delay at the input word rate fs
$Z^{-2}$ = two word delays at the input word rate fs 6. The decimator according to claim 5 wherein:
$G_1 = 2^{-4}$ and $G_2 = 2^{-9}$ 7. The decimator according to claim 5 wherein the transfer function of N(z) of said FIR filter is:

$$N(z) = 1 + 2Z^{-1} + Z^{-2}$$

8. The decimator according to claim 5 where $G_1$ and $G_2$ manifest a binary division by $2^4$ and $2^9$ respectively.

9. The decimator according to claim 1 wherein said low pass recursive filter is a second order digital filter exhibiting a response manifesting a Butterworth analog filter response.

10. The decimator according to claim 1 wherein said FIR filter comprises:
a shift register adapted to receive said input digital signal for storing therein a predetermined number of bits and for gating out a last bit upon receipt of a next bit when said predetermined number of bits are stored,
an up-down counter having an up count input responsive to said digital signal and a down count input responsive to said gated out bit to provide another digital signal consisting of a plurality of new words, with each new word having a larger number of bits than any of said input words of said input digital signal and of the same word rate as said input digital signal, wherein each of said new words manifests the average value of said plurality of bits as stored in said register and means for applying said output digital signal to said recursive filter.

11. The decimator according to claim 1 wherein said FIR filter comprises:
first and second registers, with said first register coupled to said recursive filter for storing a word therein having said increased number of bits, with said second register coupled to the output of said first register and operative to store said word when said first register receives a next word,
means for shifting the contents of said first register one place to the left to multiply said word as stored by a factor of 2, and
summing means responsive to said next word, said multiplied word and said word as stored in said second register to provide said output digital words of said greater number of bits and at a rate equal to said predetermined rate.

12. The decimator according to claim 10 wherein said input digital signal is derived from a high rate analog to digital converter having data words of one bit per word and a word rate per second of about one Megahertz (1 MHz).

13. The decimator according to claim 11 wherein said input signal to said recursive filter is said input digital signal from a high rate analog to digital converter having three bits per word and at a word rate of about 1 MHz.

14. The decimator according to claim 12 wherein said output digital words each have at least thirteen bits per word at said predetermined word rate of about 1 MHz.

15. The decimator according to claim 1 wherein said input digital signal is present in the transmit path of a telephone line circuit wherein each input digital word in said signal represents the weighted value of an analog voice signal occupying a band width relatively between 0-4 Kilohertz (Khz).

16. A recursive filter structure of the low pass type having a transfer function F(Z) enabling filter coefficients $G_1$ and $G_2$ to be of the form $2^{-K}$, where K is an integer, said recursive filter having a transfer function F(Z) equal to:

$$F(Z) = \frac{1}{1 - (2 - G_1)Z^{-1} + (1 - G_1 + G_2)Z^{-2}}$$

where:
$Z^{-1}$ = one word delay at the input word rate of a digital signal to be filtered
$Z^{-2}$ = a two word delay at the input word rate of a digital signal to be filtered,
the combination therewith of a first order error correcting circuit in said filter for implementing said coefficients $G_1$ and $G_2$ of the form $2^{-K}$, comprising:
summing means for receiving at one input thereof a digital signal of a given number of desired bits, indicative of a first digital word to be filtered, and a second input thereof for providing an error signal to provide at an output of said summing means, a new word of said desired number of bits modified by said error signal,
register means adapted to receive at an input thereof said new word and being responsive to the receipt of said new word to shift said new word a given number of bit positions indicative of a division by $2^K$, for providing a divided output word having a reduced number of bits equivalent to the N most significant bits, and means for storing the K least significant bits not employed in said output word for applying said K bits as an error signal to said second input of said summing means to be added to said next digital word, whereby each successive digital word as modified by said filter means provides a first order reduction in noise operation of said recursive filter as determined by said error signal.

17. The recursive filter according to claim 16 wherein said digital signal to be filtered is present in the transmit path of a telephone line circuit and comprises a plurality of words, each indicative of a weighted value of an analog signal and at a high word rate, said digital signal manifesting the output of an analog to digital converter present in said line circuit for converting voice signals to digital signals, with each word of a given number of bits.

18. The recursive filter according to claim 17 for use in a decimator and further including
a FIR filter coupled to said recursive filter.

19. The recursive filter according to claim 17 wherein said high word rate is 1.024 MHz at three bits per word.

20. In a recursive filter structure of the low pass type having a transfer function $F(Z)$ enabling filter coefficients $G_1$ and $G_2$ to be of the form $2^{-K}$, where K is an integer, said recursive filter having said transfer function $F(Z)$ equal to:

$$F(Z) = \frac{1}{1 - (2 - G_1)Z^{-1} + (1 - G_1 + G_2)Z^{-2}}$$

where:
$Z^{-1}$ = one word delay at the input word rate fs of a digital signal to be filtered
$Z^{-2}$ = a two word delay at said word rate fs,
the combination therewith of a second order correcting circuit for implementing said coefficients $G_1$ and $G_2$ of the form $2^{-K}$, comprising:
summing means having first, second and third inputs, means for applying at said first input a digital signal of a given number of desired bits, indicative of a first word to be filtered, for providing at an output, a new word of said desired number of bits modified by first and second error signals applied to said second and third inputs,
first register means adapted to receive said new word and responsive to the receipt of said new word to shift the same a given number of places indicative of a division by $2^K$ for providing a divided output word at a reduced number of bits N equivalent to the N most significant bits, and means for storing the K least significant bits not employed in said output word,
logic means for storing said K least significant bits including means for shifting said K bits one place to the left to multiply the same by a factor of two, for applying said multiplied K bits to said second input of said summing means to modify the next word received at said input, and means for applying said K bits as stored to said third input of said summing means for modifying the word after said next word as received at said first input, wherein all words received at said first input will be modified by both said K bits and said multiplied K bits to provide a second order error reduction in noise operation of said recursive filter as determined by both said K bits and said multiplied K bits.

21. The recursive filter according to claim 20 wherein said digital signal to be filtered is present in the transmit path of a telephone line circuit and comprises a plurality of words, each of the same number of given bits, with each word indicative of the weighted value of an analog signal and at a high word rate, said digital signal manifesting the output of an analog to digital converter present in said line circuit for converting voice signals to digital signals.

22. The recursive filter according to claim 21 wherein said high word rate is 1.024 MHz at one bit per word.

23. A method of implementing the coefficients $G_1$ and $G_2$ as present in a recursive filter structure having a transfer function $F(Z)$ equal to:

$$F(Z) = \frac{1}{1 - (2 - G_1)Z^{-1} + (1 - G_1 + G_2)Z^{-2}}$$

where:
$Z^{-1}$ = one word delay at the input word rate fs of a digital signal to be filtered
$Z^{-2}$ = a two word delay at said rate fs comprising the steps of:
selecting $G_1$ and $G_2$ to be of the form $2^{-K}$ where K is an integer,
dividing a digital signal processed by inserting said signal in a register, shifting said contents K places to the right to perform a division by $2^K$, to provide a divided digital signal, having a given number of bits, N+K,
truncating said divided signal into a given number of most significant bits N, to provide a signal indicative of a coefficient as $G_1$ or $G_2$,
storing said K least significant bits,
adding said K bits as stored to the next digital signal received by said dividing means to provide an error corrected signal for said dividing means operative to reduce inband noise of a first order.

24. A telephone subscriber line circuit for coupling a subscriber to a digital transmission path in a telephone switching system, comprising in combination:
two-to-four wire converter means coupled to a near-end subscriber line to provide a transmit path and a receive path for said line,
an analog to digital converter means for sampling low-rate near-end analog signals to generate a high rate pulse stream of 1-bit digital words representative of said near end analog signals,
decimator means for transforming groups of said high rate 1-bit digital words into corresponding multiple-bit digital words and for discarding a predetermined number of multiple bit words in sequential sets to provide a decimated output signal at a decreased word rate, said decimator comprising:
a cascaded digital filter arrangement having an input and an output terminal, with a finite impulse response filter (FIR) in cascade with and coupled to the input of a second order digital low pass recursive filter characterized in having a transfer function defining filter coefficients to be of the form $2^{-K}$, where K is an integer, to permit filtering of said digital signal from said analog to digital converter as applied to said input terminal of said cascaded arrangement, to provide at said output terminal, an output filtered digital signal having a plurality of words, each of said greater number of bits and at said high word rate,
register means responsive to said filtered output signal from said recursive filter of said greater number of bit words for transferring said output signal at a lower rate than said predetermined rate, whereby said register means provides at an output, a decimated signal having a decreased word rate, each of said words having a greater bit length and manifesting the weighted value of said input words from said analog to digital converter;

means for applying said decimated digital signal to said digital transmission path, means coupled to said digital transmission path adapted to receive a far end digital signal of the same format as said applied decimated digital signal, interpolator means responsive to said decimated digital signal as received for providing a second digital signal having a lesser number of bits than said far digital signal and an increased word rate, digital to analog converter means in said receive path of said line circuit and coupled to the output of said interpolator means and responsive to said second digital signal to provide an analog signal at its output, said output from said interpolator manifesting said far end analog signal, means for coupling said far end analog signal to said two-to-four wire converter means to enable a subscriber to receive and therefore respond to said far end analog signals.

25. The telephone line circuit according to claim 24 wherein said high word rate digital signal from said analog to digital converter is at about a 1.024 MHz word rate with each word having the same number of bits, between one to three, the output of said decimator being at about a 32 KHz word rate with each word of said decimator output having the same number of bits, said same number being at least thirteen bits.

26. The telephone line circuit according to claim 24 wherein said analog signals are voice signals having bandwidths relatively between 0 to 4 KHz.

* * * * *